United States Patent
Yamamoto

(10) Patent No.: US 7,120,891 B2
(45) Date of Patent: Oct. 10, 2006

(54) MASTER SLICE SEMICONDUCTOR INTEGRATED CIRCUIT

(75) Inventor: Kenji Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 193 days.

(21) Appl. No.: 10/718,515

(22) Filed: Nov. 24, 2003

(65) Prior Publication Data

US 2004/0103382 A1 May 27, 2004

(30) Foreign Application Priority Data

Nov. 27, 2002 (JP) ............................. 2002-344196

(51) Int. Cl.
*G06F 17/50* (2006.01)
(52) U.S. Cl. .............................. 716/12; 716/13; 716/14
(58) Field of Classification Search .................. 716/12, 716/15, 6, 13, 14
See application file for complete search history.

(56) References Cited

U.S. PATENT DOCUMENTS 5,825,203 A * 10/1998 Kusunoki et al. ............. 326/41
6,421,816 B1 * 7/2002 Ishikura .......................... 716/7
6,502,226 B1 * 12/2002 Ishikura .......................... 716/7
6,737,903 B1 * 5/2004 Suzuki ........................ 327/293
2003/0051221 A1 3/2003 Mizuno et al.

FOREIGN PATENT DOCUMENTS

JP 2003-152082 A 5/2003

* cited by examiner

*Primary Examiner*—Sun James Lin
(74) *Attorney, Agent, or Firm*—Foley & Lardner LLP

(57) ABSTRACT

It is an object of the present invention to reduce power consumption and improve flexibility in a master slice semiconductor integrated circuit. The master slice semiconductor integrated circuit comprises at least two wiring layers to form wirings, and a plurality of clock buffers connected by clock wirings in the form of a clock tree having at least two cascaded stages to distribute clock signals to a plurality of sequential circuits, wherein the clock wirings comprises a wiring layer switching portion which switches a wiring layer from a lower wiring layer of the at least two wiring layers to an upper wiring layer of the at least two wiring layers and then switches from the upper wiring layer to the lower wiring layer.

14 Claims, 7 Drawing Sheets

MASTER SLICE SEMICONDUCTOR INTEGRATED CIRCUIT

BACKGROUND OF THE INVENTION

1. Field of the Invention

The present invention relates to a master slice semiconductor integrated circuit, and in particular to a master slice semiconductor integrated circuit which has a clock tree structure formed by a dedicated fixed wiring layer.

2. Description of the Related Art

In general, a logic circuit includes combinational circuits which are constituted by gates and the like, and sequential circuits such as flip-flops or latches which take in a signal in synchronization with an edge or a level of a clock signal. Circuit connection of these combinational circuits and sequential circuits is different depending upon customer specifications.

Conventionally, in order to efficiently manufacture an semiconductor integrated circuit corresponding to the logic circuit of the customer specifications, a wafer for master slice, which is processed up to a manufacturing process common to customer specifications by regularly arranging a basic cell repeatedly in an internal region, is manufactured in advance. Then, according to a customer request, in a customized wiring process, a gate, a flip-flop, and the like are constituted and connected by wirings of a customized wiring layer, which is automatically wired on the basis of the customer specifications, to manufacture a master slice semiconductor integrated circuit for the respective customer specifications.

In this case, naturally, the number of sequential circuits and an arrangement thereof in the logic circuit are different depending upon the customer specifications. Clock skew, which is a delay difference among clock inputs of the respective sequential circuits, occurs due to a distance from a clock input terminal to the clock input of the respective sequential circuits or a length of a clock wiring. When this clock skew reaches or exceeds a predetermined value, some sequential circuits start to malfunction, and the logic circuit as a whole malfunctions. In particular, in the case in which the respective sequential circuits operate on the basis of multiphase clock signals, malfunction due to clock skew among the multiphase clock signals are more likely to occur.

In order to avoid the malfunction due to clock skew, various clock signal distribution circuits have been used in a master slice semiconductor integrated circuit so as to have low clock skew. For example, FIG. 1 is an arrangement diagram showing an example of arrangement of a clock distribution circuit in a chip of a master slice semiconductor integrated circuit. (see: JP-A-2003-152082) Here, clock wirings in the clock distribution circuit are collectively shown as a bus wiring.

This master slice semiconductor integrated circuit includes the clock distribution circuit in an internal region where cells 3 dedicated for combinational circuits and cells 2 dedicated for sequential circuits are arranged alternately by a unit of column and connected by wirings of a customized wiring layer on the basis of customer specifications. This clock distribution circuit, considering that an entire internal region is a highest order divided region A1, hierarchically divides the internal region into four equally. A selector 1, selectors 21 to 24, and selectors 301 to 316, which select clock signals and also operate as clock buffers, are embedded and arranged in divided regions A1, A21 to A24, and A301 to A316 of three hierarchies from the highest order (A1) to the lowest order (A301 to A316). In addition, output wirings of these selectors 1, 21 to 24, and 301 to 316 are branched in a tree shape by wirings of a fixed wiring layer dedicated for a clock wiring in advance. Clock signals CK1 to CK8 of eight phases of an external input are selectively distributed to the cells 2 dedicated for sequential circuits of the lowest order divided regions A301 to A316 from four directions in the circumference.

FIG. 2 is a circuit diagram showing an example of the clock distribution circuit in this master slice semiconductor integrated circuit. This clock distribution circuit includes twenty-one selectors 1, 21 to 24, and 301 to 316 which are connected in a cascade pattern of three stages in a tree shape in association with the respective divided regions A1, A21 to A24, and A301 to A316 of the highest order to lowest order three hierarchies.

The selector 1 is in the highest stage and includes eight multiplexers which are inputted with clock signals CK1 to CK8 of eight phases from the outside and select one of the clock signals. These eight multiplexers are divided into two groups, each of which consists of four multiplexers. Each group of the multiplexers outputs total four phases of clock signals to two selectors 21 and 23 or 22 and 24 of the next stage through a bus.

The two selectors 21 and 23 include four multiplexers, which are inputted with four phases of clock signals divided and outputted for each group from the selector 1 of the former stage, and select one of the clock signals, respectively. The four multiplexers of the selector 21 are divided into two groups, each of which consists of two multiplexers. Each group of the multiplexers outputs total two phases of clock signals to the two selectors 301 and 303 or 302 and 304 of the next stage through a bus. In addition, the four multiplexers of the selector 23 are divided into two groups, each of which consists of two multiplexers. Each group of the multiplexers outputs total two phases of clock signals to the two selectors 309 and 311 or 310 and 312 of the next stage through a bus.

Similarly, the two selectors 22 and 24 include four multiplexers, which are inputted with four phases of clock signals divided and outputted for each group from the selector 1 of the former stage, and select one of the clock signals, respectively. The four multiplexers of the selector 22 are divided into two groups, each of which consists of two multiplexers. Each group of the multiplexers outputs total two phases of clock signals to the two selectors 305 and 307 or 306 and 308 of the next stage through a bus. In addition, the four multiplexers of the selector 24 are divided into two groups, each of which consists of two multiplexers. Each group of the multiplexers outputs total two phases of clock signals to the two selectors 313 and 315 or 314 and 316 of the next stage through a bus.

The sixteen selectors 301 to 316 are in the lowest stage. The selectors 301 to 316 include a multiplexer, which is inputted with two phases of clock signals divided and outputted for each group from the four selectors 21 to 24 of the former stage, select one of the clock signals, and output the clock signal to the cells 2 dedicated for sequential circuits of the lowest order divided regions A301 to A316, respectively. For example, the two selectors 301 and 303 are inputted with two phases of clock signals divided and outputted from the selector 21 of the former stage, select one of the clock signals, and output the clock signal to the cells 2 dedicated for sequential circuits of the lowest order divided regions A301 and A303, respectively. The other selectors 303 to 316 operate in the same manner as a group of two, and output a clock signal to the cells dedicated for a sequential circuit of the divided regions A303 to A316 of the lowest order, respectively.

In addition, all the multiplexers constituting the above-described each selector can select one of input clock signals on the basis of a control signal. As the control signal, a potential of a power supply or the ground is supplied to the respective multiplexers according to the wirings of the customized wiring layer.

Therefore, the clock distribution circuit in this conventional master slice semiconductor integrated circuit can select inputs of clock signals, which are required in the respective lower divided regions, in the respective selector of each stage connected in a cascade pattern in a tree shape in association with the respective divided regions of the respective hierarchies of the highest to lowest orders. In addition, the clock distribution circuit can select an arbitrary clock signal from multiphase clock signals on the basis of customer specifications and distribute the clock signal to the cells 2 dedicated for sequential circuits of the lowest order. Further, output wirings of the respective selectors are branched in an equal load and an equal wiring length in a tree shape according to the wirings of the dedicated fixed wiring layer, and the multiphase clock signals are distributed at an equal delay from the selectors of the first stage to the cells 2 dedicated for sequential circuits of the respective divided regions of the lowest order. Since this equal delay distribution of the clock signals is performed with high accuracy according to a master slice design, clock skew is reduced.

As described above, circuit connection of logic circuits is different depending upon customer specifications, and a ratio of sequential circuits and the number of phases of clock signals required for the sequential circuits are also different.

On the other hand, in the case in which the ratio of the sequential circuits of the logical circuit is small, in general, the conventional mater slice semiconductor integrated circuit can constitute the sequential circuits using a part of the divided regions, which are hierarchically divided equally, and can connect the entire logic circuit. However, even in the other divided regions which do not constitute the sequential circuits, clock signals are sequentially distributed to the cells dedicated for sequential circuits by the clock distribution circuit, the respective selectors operate, and clock wirings formed by dedicated fixed wirings repeat charge and discharge at a clock frequency. Since the clock frequency is a highest frequency, power consumption by charge and discharge of respective node of the clock distribution circuit is generally large. In addition, there is a problem in that the power consumption of the clock distribution circuit depends upon the master slice design, and is not proportional to a size of a the logic circuit of customer design and always takes a maximum value.

Further, in the conventional master slice semiconductor integrated circuit, a circuit area in the part of the clock distribution circuit increases exponentially with respect to not only an increase in the number of hierarchies of equal division but also an increase in the number of phases of clock signals which can be distributed. Practically, there is a problem in that the number of phases of clock signals cannot be increased so much, a range of application of the master slice semiconductor integrated circuit is small, and it is impossible to flexibly cope with an increase in the number of phases of clock signals due to a change in customer specifications or the like.

SUMMARY OF THE INVENTION

Therefore, it is an object of the present invention to reduce power consumption and improve flexibility of a master slice semiconductor integrated circuit.

Thus, the present invention provides a master slice semiconductor integrated circuit includes at least two wiring layers for wirings, and a plurality of clock buffers connected by clock wirings in the form of a clock tree having at least two cascaded stages to distribute clock signals to a plurality of sequential circuits, wherein the clock wiring among the clock buffers comprises a wiring layer switching portion which switches a wiring layer from a lower wiring layer of the at least two wiring layers to an upper wiring layer of the at least two wiring layers and then switches from the upper wiring layer to the lower wiring layer.

Also, in one configuration example the master slice semiconductor integrated circuit in the present invention the clock buffers are selectors, and the selectors comprise a multiplexer which select and outputs a clock signal from a plurality of clock signals.

Also, in one configuration example the master slice semiconductor integrated circuit in the present invention the wiring layer switching portion comprises an output wiring which is formed of the lower wiring layer and connects one end thereof to the clock output of the clock buffer of a former stage, an output side via wiring which connects one end thereof to the other end of the output wiring and connects the other end thereof to the upper wiring layer, an input wiring which is formed of the lower wiring layer and connects one end thereof to the clock input of the clock buffer of a later stage, and an input side via wiring which connects one end thereof to the other end of the input wiring and connects the other end thereof to the upper wiring layer, and wherein the upper wiring layer is a wiring layer for customized wirings and said lower wiring layer is a wiring layer for fixed wirings.

Also, in one configuration example the master slice semiconductor integrated circuit in the present invention further comprises a wiring which is formed of the upper wiring layer and connects the other end of the output side via wiring and the other end of the input side via wiring.

Also, in one configuration example the master slice semiconductor integrated circuit in the present invention further comprises a wiring which is formed of the upper wiring layer and connects the other end of the input side via wiring and a fixed voltage source.

Also, in one configuration example the master slice semiconductor integrated circuit in the present invention further comprises a wiring which is formed of the upper wiring layer and connects an output of a circuit other than the clock buffers and the other end of the input side via wiring.

Also, in one configuration example the master slice semiconductor integrated circuit in the present invention further comprises a wiring which is formed of the upper wiring layer and connects an output of a circuit other than the clock buffers and the other end of the output side via wiring.

Also, in one configuration example the master slice semiconductor integrated circuit in the present invention further comprises a wiring which has a dummy load capacity equivalent to a load capacity connected to the input side via wiring, and is formed of the upper wiring layer and connected to the other end of the output side via wiring.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED-EMBODIMENTS

Figure 3:
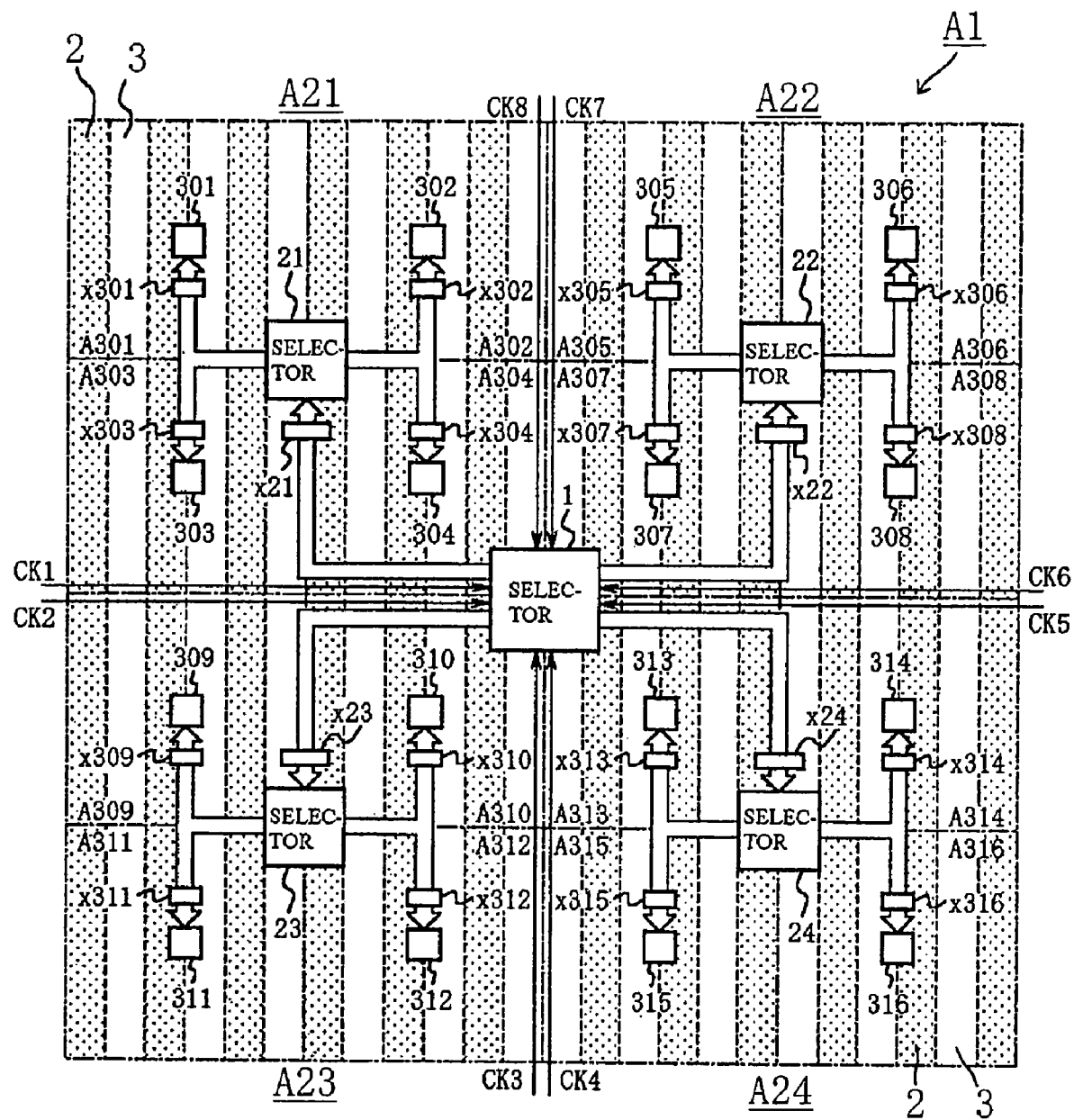
FIG. 3 is an arrangement diagram showing an example of arrangement of a clock distribution circuit in an embodiment of a master slice semiconductor integrated circuit chip of the present invention.

Next, the present invention will be described with reference to the accompanying drawings. FIG. 3 is an arrangement diagram showing an example of arrangement of a clock distribution diagram in an embodiment of a master slice semiconductor integrated circuit chip of the present invention. As in the conventional master slice semiconductor integrated circuit shown in FIG. 1, the master slice semiconductor integrated circuit of this embodiment includes a clock distribution circuit in an internal region where cells 3 dedicated for combinational circuits and cells 2 dedicated for sequential circuits are arranged alternately by a unit of column and connected by wirings of a customized wiring layer on the basis of customer specifications.

The clock distribution circuit in the master slice semiconductor integrated circuit of this embodiment, considering that an entire internal region is a highest order divided region A1, hierarchically divides the internal region into four equally (A21 to A24, and A301 to A316). Selector 1, selectors 21 to 24, and selectors 301 to 316 are embedded and arranged in divided regions A1, A21 to A24, and A301 to A316 of three hierarchies from the highest order to the lowest order. In addition, output wirings of these selectors 1, 21 to 24, and 301 to 316 are branched in a tree shape by wirings of a fixed wiring layer dedicated for a clock wiring in advance, and wiring layer switching portions X21 to X24 and X301 to X316 are provided in branched wirings, respectively. Clock signals CK1 to CK8 of eight phases of an external input are selectively distributed to the cells 2 dedicated for sequential circuits of the lowest order divided regions A301 to A316.

Figure 4:
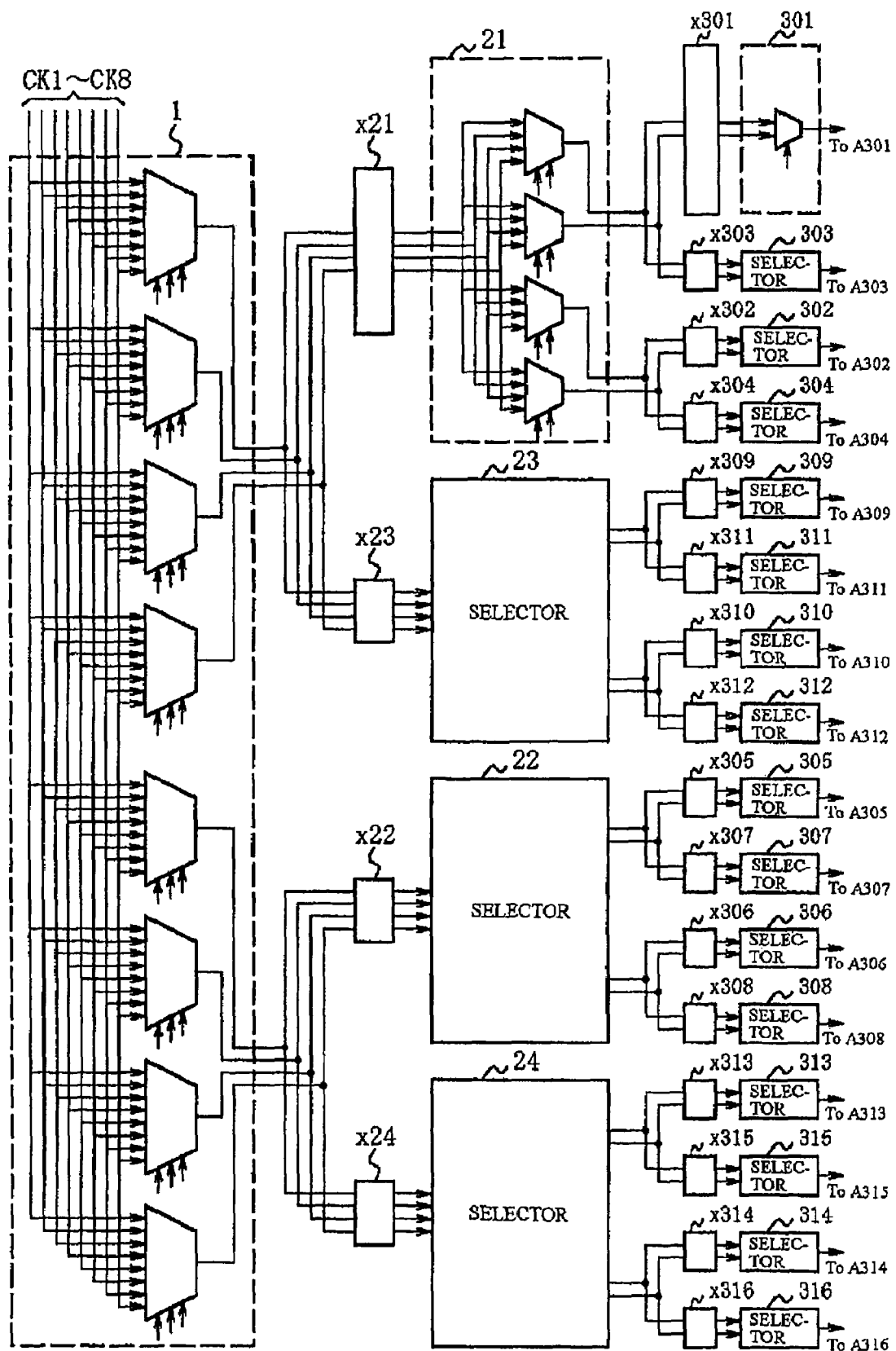
FIG. 4 is a circuit diagram showing an example of the clock distribution circuit in the master slice semiconductor integrated circuit of FIG. 3.

FIG. 4 is a circuit diagram showing an example of the clock distribution circuit in the master slice semiconductor integrated circuit of this embodiment. The clock distribution circuit of the master slice semiconductor integrated circuit of this embodiment is different from the clock distribution circuit of the conventional master slice semiconductor integrated circuit shown in FIG. 1 only in that the wiring layer switching portions X21 to X24 and X301 to X316 are provided in clock wirings among these selectors 1, 21 to 24, and 301 to 316, respectively. Selectors 1, 21 to 24, and 301 to 316 are identical with selectors of the conventional master slice semiconductor integrated circuit shown in FIG. 1, respectively. Therefore, concerning the internal structure of the respective selectors 1, 21 to 24, and 301 to 316, duplicate explanation will be omitted, and the wiring layer switching portions X21 to X24 and X301 to X316 will be described next.

Figure 5:
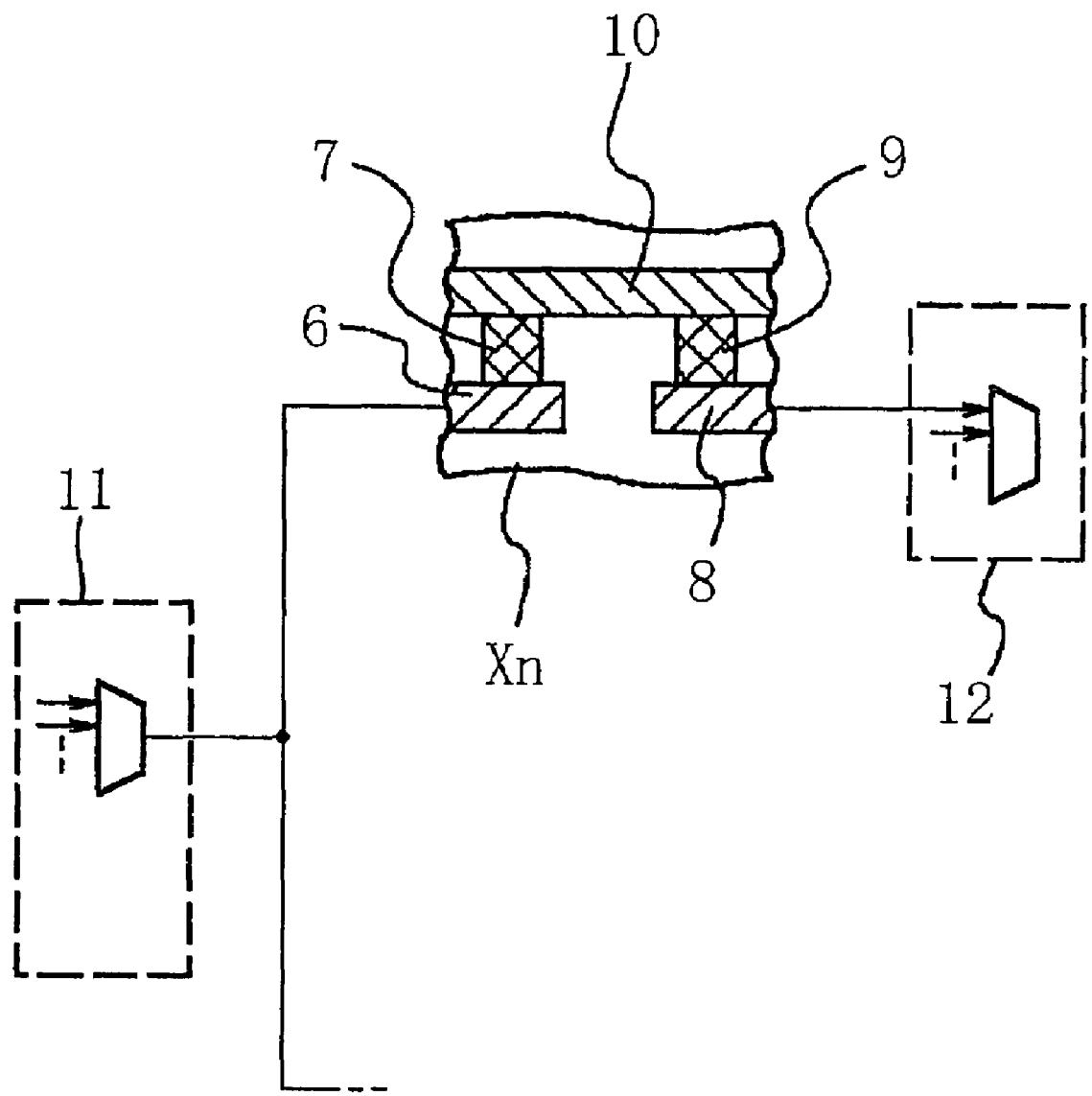
FIG. 5 is a sectional view showing an example of a structure of wiring layer switching portions X21 to X24 and X301 to X316 in the clock distribution circuit of FIG. 4 for one clock wiring.

FIG. 5 is a sectional view showing an example of a structure of these wiring layer switching portions Xn (X21 to X24 and X301 to X316) for one clock wiring. Referring to FIG. 5, these wiring layer switching portions X21 to X24 and X301 to X316 include a fixed output wiring 6, an output side via wiring 7, a fixed input wiring 8, and an input side via wiring 9, respectively. The fixed output wiring 6 is formed of a fixed wiring layer and connects one end thereof to a clock output of a selector of a former stage. The output side via wiring 7 connects one end thereof to the other end of the fixed output wiring 6 and connects the other end thereof to the customized wiring layer 10. In addition, the fixed input wiring 8 is formed of the fixed wiring layer and connects one end thereof to a clock input of a selector of a later stage. The input side via wiring 9 connects one end thereof to the other end of the fixed input wiring 8 and connects the other end thereof to the customized wiring layer 10.

In addition, before a customized wiring process for forming wirings of the customized wiring layer, that is, in a state of a wafer for master slice, as shown in FIG. 5, the wiring layer switching portions X21 to X24 and X301 to X316 connect the other ends of the output side via wiring 7 and the input side via wiring 9 to an entire film of the customized wiring layer 10 before customizing, respectively. Further, after the customized wiring process, these wiring layer switching portions X21 to X24 and X301 to X316 include wirings, which are formed of the customized wiring layer 10 and customized on the basis of customer specification, respectively.

FIGS. 6A to 6D are wiring diagrams showing examples of wiring 101 of the customized wiring layer 10 of these wiring layer switching portions Xn (X21 to X24 and X301 to X316) for one clock wiring. Next, the respective examples of wiring will be described.

Figure 6A:
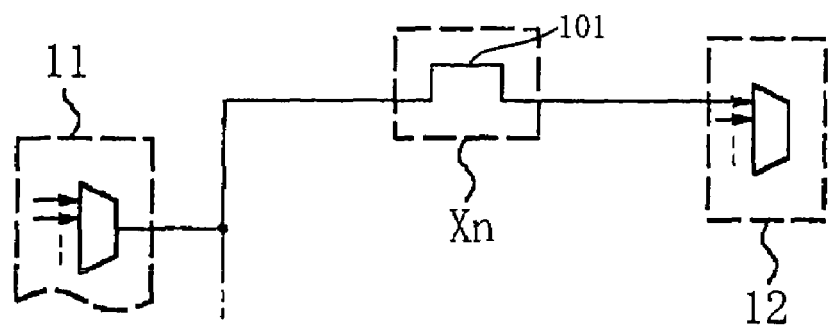
FIGS. 6A to 6D are wiring diagrams showing examples of wiring of a customized wiring layer of the wiring layer switching portions X21 to X24 and X301 to X316 in the clock distribution circuit of FIG. 4.

First, after the customized wiring process, as shown in the example of wiring of FIG. 6A, these wiring layer switching portions Xn (X21 to X24 and X301 to X316) may include a wiring 101 of the customized wiring layer 10 which connects the other end of the output side via wiring 7 and the input side via wiring 9. In this case, an output clock of a selector 11 of a former stage is transmitted to a clock input of a selector 12 of the next stage via the wiring layer switching portion Xn with the delay of the master slice design, and a clock signal of an external input is distributed with low clock skew as in the conventional master slice semiconductor integrated circuit.

Figure 6B:
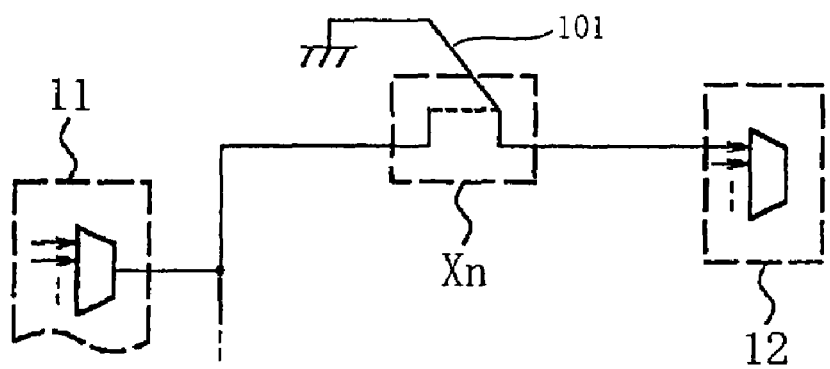

In addition, as shown in the example of wiring of FIG. 6B, these wiring layer switching portions X21 to X24 and X301 to X316 may include a wiring 101 of the customized wiring layer which connects the other end of the input side via wiring 8 and the ground. In this case, a clock input of a selector 12 of the next stage is fixed to a fixed voltage of a power supply or the ground. Consequently, in selectors of the next stage and subsequent stages, a load of each node is not charged or discharged, and power consumption is cut. A clock signal can be distributed to only divided regions which require connection of a sequential circuit on the basis of customer specifications. Thus, power consumption of the clock distribution circuit and the master slice semiconductor integrated circuit can be reduced.

Figure 6C:
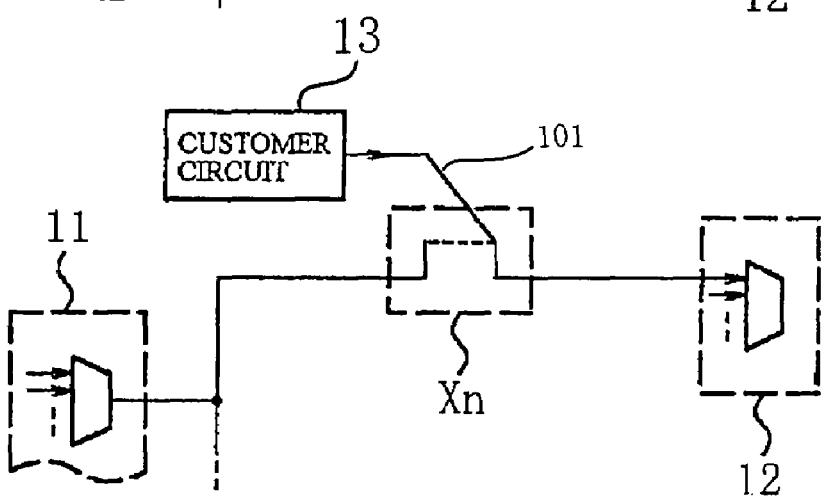

In addition, as shown in the example of wiring of FIG. 6C, these wiring layer switching portions Xn (X21 to X24 and X301 to X316) may include a wiring 101 of the customized wiring layer 10 which connects an output of a customer circuit 13 configured by the wiring of the customized wiring layer 10 and the other end of the input side via wiring 8. In this case, the customer circuit 13 can generate a clock signal and adjust delay on the basis of customer specifications to transmit the clock signal to a clock input of a selector 12 of the next stage. Consequently, it is possible to flexibly cope with an increase in the number of phases of a clock signal due to a change in customer specifications or the like. In addition, even in the case in which the number of a clock signal of customer specification exceeds the number of phases of the master slice design, it is possible to flexibly cope with this problem.

In addition, in the examples of wiring of FIGS. 6B and 6C, if an output of a selector 11 of a former stage is used in another selector of a later stage, these wiring layer switching portions Xn (X21 to X24 and X301 to X316) may include a wiring (not shown) of the customized wiring layer which has a dummy load capacity equivalent to a load capacity connected to the input side via wiring and is connected to the other end of the output side via wiring. Consequently, a load capacity of an output wiring 6 of the selector 11 of the former stage is compensated to the value of the master slice design. A clock signal is distributed to cells 2 dedicated for sequential circuits of a divided region corresponding to another selector of the later stage at an equal delay according to the master slice design.

Figure 6D:
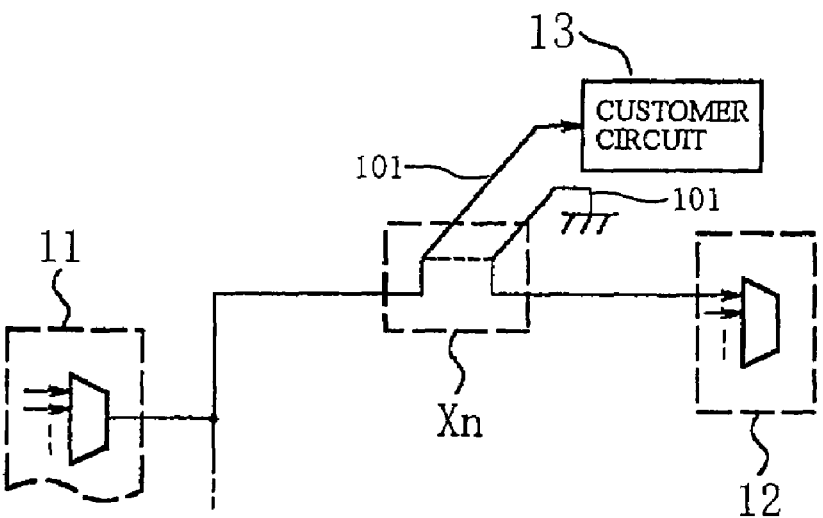

Further, as shown in the example of wiring of FIG. 6D, these wiring layer switching portions Xn (X21 to X24 and X301 to X316) may include a wiring 101 of the customized wiring layer 10 which connects an input of a customer circuit 13 configured by the wiring of the customized wiring layer 10 and the other end of the output side via wiring 7. In this case, the customer circuit 13 can input an output of a selector 11 of a former stage to carry out various functions on the basis of customer specifications. For example, the customer circuit 13 can input a clock signal of an earlier phase from the middle stage of the clock distribution circuit. The customer circuit 13 may adjust delay of the clock signal after processing the clock signal according to another control signal, and generate a clock signal peculiar to the customer specifications with low clock skew. Consequently, it is possible to flexibly cope with a logic circuit of the customer specifications.

Figure 1:
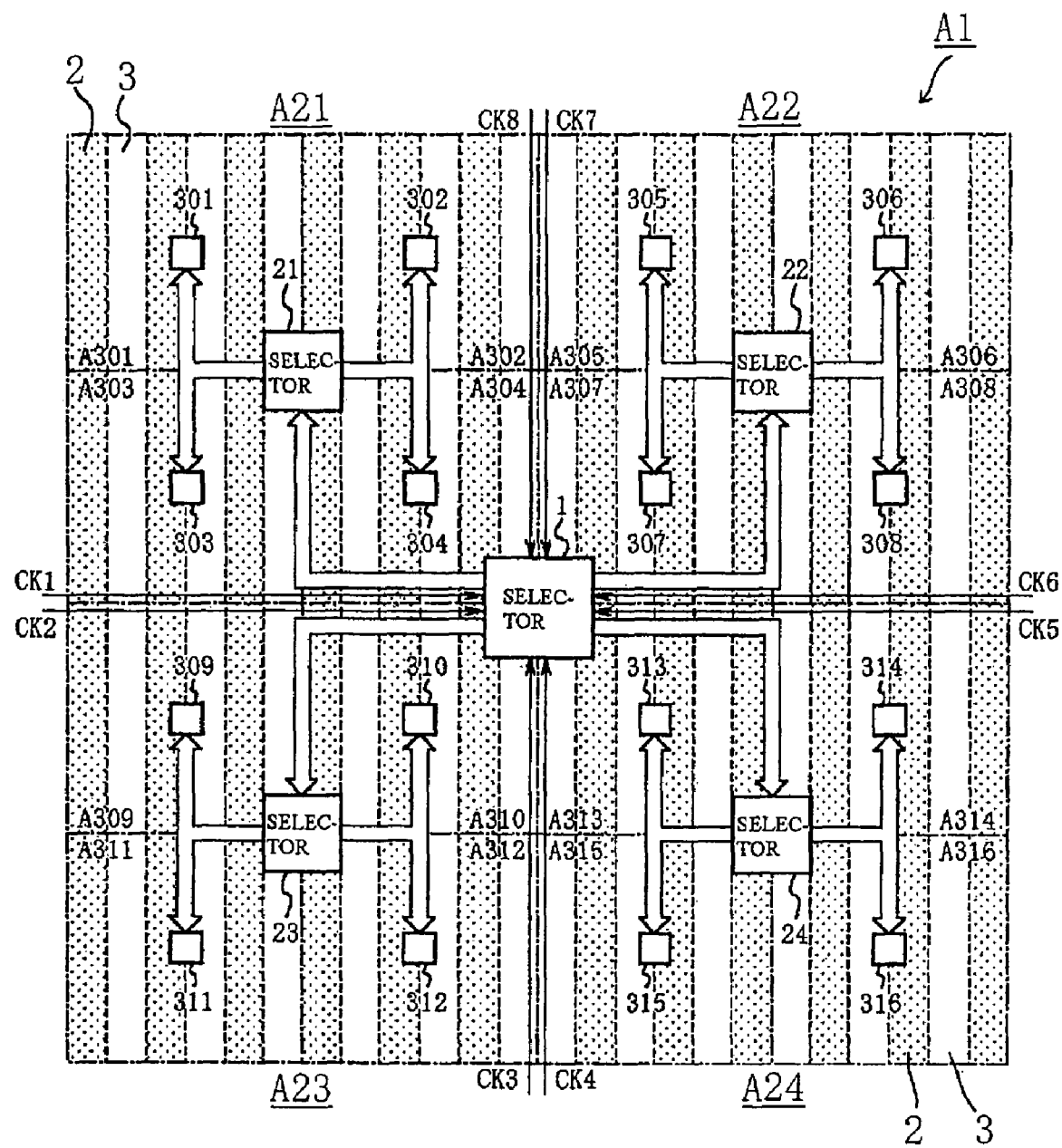
FIG. 1 is an arrangement diagram showing an example of arrangement of a clock distribution circuit in a chip of a master slice semiconductor integrated circuit.
Figure 2:
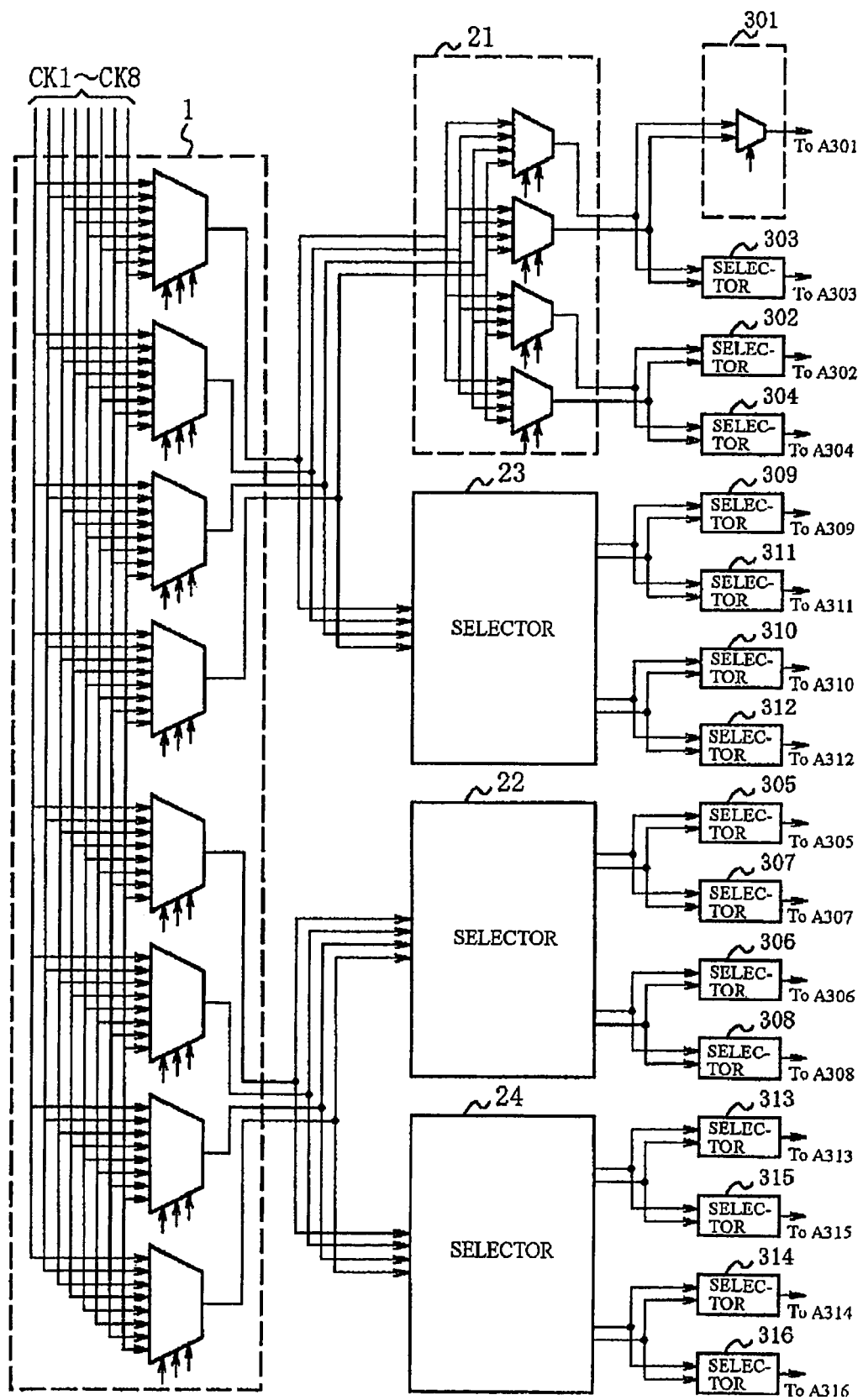
FIG. 2 is a circuit diagram showing an example of the clock distribution circuit in the master slice semiconductor integrated circuit of FIG. 1.

Note that it is explained above that, in the master slice semiconductor integrated circuit of the above-described embodiment, as in the conventional master slice semiconductor integrated circuit shown in FIG. 1, cells dedicated for combinational circuits 3 and cells dedicated for sequential circuits 2 are arranged alternately by a unit of column. However, the present invention is not limited to this constitution. It would be evident that a modification in which the cells dedicated for combinational circuits 3 and the cells dedicated for sequential circuits 2 are simply arranged at a fixed ratio in advance is also possible, and the same effects can be realized by the modification.

In addition, it is explained above that, in the master slice semiconductor integrated circuit of the above-described embodiment, as in the conventional master slice semiconductor integrated circuit shown in FIG. 1, an internal region is hierarchically divided equally, selectors are embedded and arranged in respective divided regions from a highest order region to a lowest order region, and output wirings thereof are branched in a tree shape by a wiring of a dedicated fixed wiring layer, respectively. However, the present invention is not limited to this constitution. Various modifications using a gate instead of a selector are possible.

Figure 7:
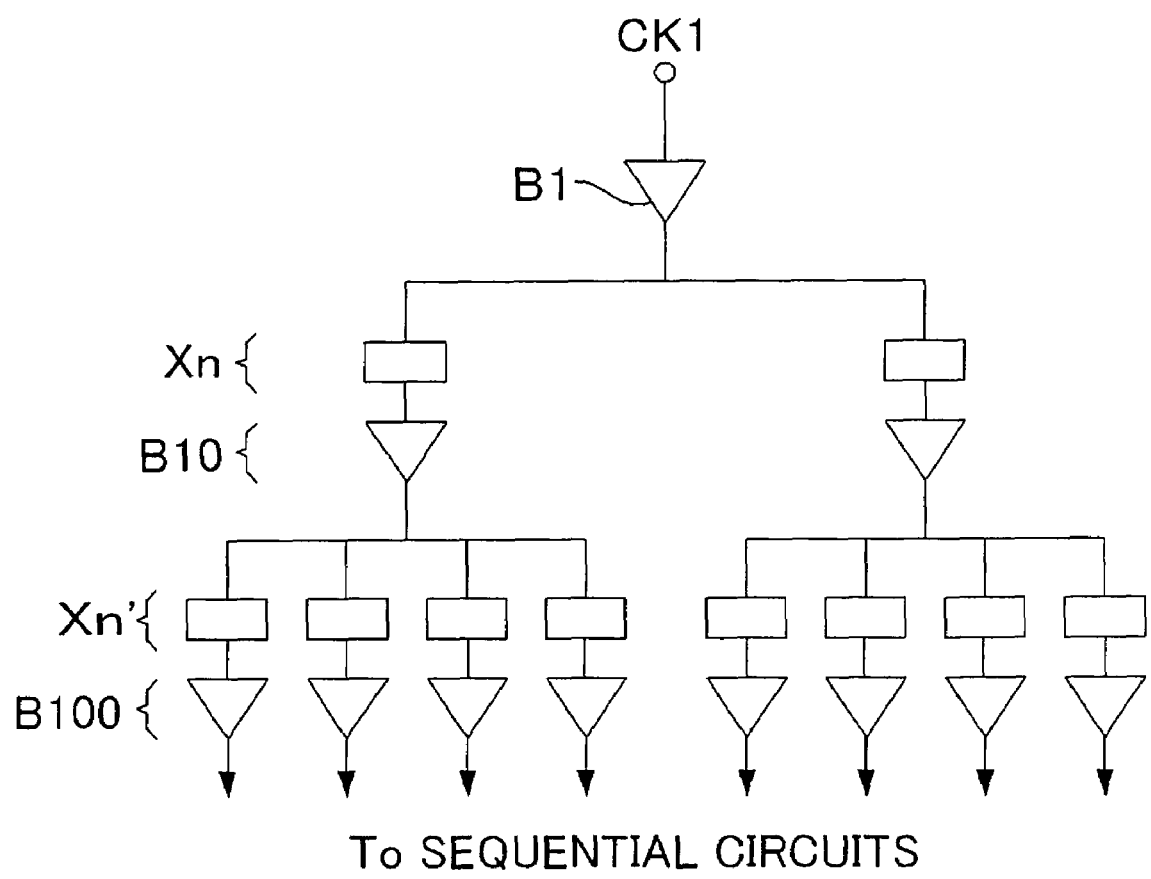
FIG. 7 is a circuit diagram showing an example of the clock distribution circuit using simple buffers which have a single clock input and a single clock output.

For example, as a most simple modification, there is one which uses a simple buffer which has a single clock input and a single clock output instead of a selector. FIG. 7 is a circuit diagram showing an example of the clock distribution circuit using simple buffers which have a single clock input and a single clock output. A master slice semiconductor integrated circuit of this modification including a clock distribution circuit in which an internal region, which has cells dedicated for combination circuits and cells dedicated for sequential circuits arranged at a fixed ratio and is connected by wirings of a customized wiring layer on the basis of customer specifications, is hierarchically divided equally to embed and arrange buffers B1, B10, and B100 in respective divided regions from a highest order region to a lowest order region, and output wirings thereof are branched in a tree shape by wirings of a dedicated fixed wiring layer to distribute a clock signal to the cells dedicated for sequential circuits of the divided region of the lowest order. In addition, clock wirings among the buffers of this clock distribution circuit include a wiring layer switching portion (Xn, and Xn') which switches a wiring layer from the fixed wiring layer to the customized wiring layer and then switches the wiring layer from the customized wiring layer to the fixed wiring layer.

In the master slice semiconductor integrated circuit of this modification, the examples of wirings of the customized wiring layers of the wiring layer switching portions X21 to X24 and X301 to X316 shown in FIGS. 6A to 6D can be applied as a wiring layer switching portion (Xn, and Xn'). Consequently, the master slice semiconductor integrated circuit can cope with not only a clock signal of a single phase according to the master slice design but also multiphase clock signals. Thus it would be clear that the same effects as those in the master slice semiconductor integrated circuit of the embodiment can be realized.

As described above, the master slice semiconductor integrated circuit according to the present invention includes wiring layer switching portions in clock wirings among selectors or buffers of a clock distribution circuit. By wirings of a customized wiring layer of the wiring layer switching portions, as in the conventional design, a clock signal of an external input is distributed with low clock skew, and power consumption of the master slice semiconductor integrated circuit is reduced in association with customer specifications. Thus, for example, there is an effect that it is possible to flexibly cope with the customer specifications or a change in the customer specifications.

What is claimed is:

1. A master slice semiconductor integrated circuit, comprising:
    at least two wiring layers for wiring; and
    a plurality of clock buffers connected by clock wirings in a form of a clock tree having at least two cascaded stages to distribute clock signals to a plurality of sequential circuits;
    wherein each of said clock wirings among said plurality of clock buffers comprises a wiring layer switching portion which switches a clock wiring from a lower wiring layer of said at least two wiring layers to an upper wiring layer of said at least two wiring layers and then switches said clock wiring from said upper wiring layer to said lower wiring layer;
    wherein said wiring layer switching portion comprises:
        an output wiring which is formed of said lower wiring layer and connects one end thereof to a clock output of a clock buffer of a former stage;
        an output side via wiring which connects one end thereof to the other end of said output wiring and connects the other end thereof to said upper wiring layer;
        an input wiring which is formed of said lower wiring layer and connects one end thereof to a clock input of a clock buffer of a later stage; and
        an input side via wiring which connects one end thereof to the other end of said input wiring and connects the other end thereof to said upper wiring layer; and
    wherein said upper wiring layer is a wiring layer for customized wirings, and said lower wiring layer is a wiring layer for fixed wirings.

2. The master slice semiconductor integrated circuit according to claim 1, further comprising a wiring which is formed of said upper wiring layer and connects the other end of said output side via wiring and the other end of said input side via wiring.

3. The master slice semiconductor integrated circuit according to claim 1, further comprising a wiring which is formed of said upper wiring layer and connects the other end of said input side via wiring and a fixed voltage source.

4. The master slice semiconductor integrated circuit according to claim 1, further comprising a wiring which is formed of said upper wiring layer and connects an output of a circuit other than said clock buffers and the other end of said input side via wiring.

5. The master slice semiconductor integrated circuit according to claim 1, further comprising a wiring which is formed of said upper wiring layer and connects an output of a circuit other than said plurality of clock buffers and the other end of said output side via wiring.

6. The master slice semiconductor integrated circuit according to claim 1, further comprising a wiring which has a dummy load capacity equivalent to a load capacity connected to said input side via wiring, and is formed of said upper wiring layer and connected to the other end of said output side via wiring.

7. A semiconductor device comprising:
    a semiconductor substrate;
    a first wiring layer above said semiconductor substrate, said first wiring layer being formed as a customized wiring layer such that a pattern of said first wiring layer is determined based on customer specifications;
    a second wiring layer between said semiconductor substrate and said first wiring layer, said second wiring layer being formed as a fixed wiring layer such that a pattern of said second wiring layer is determined independently of the customer specifications;
    a first clock output circuit formed in said semiconductor substrate and outputting a first clock signal through a first clock output wiring, said first clock output wiring being formed of said second wiring layer;
    a first clock input circuit formed in said semiconductor substrate and receiving the first clock signal through a first clock input wiring, said first clock input wiring being formed of said second wiring layer; and
    a first connecting wiring formed of said first wiring layer to make an electrical connection path between said first clock output wiring and said first clock input wiring.

8. The device as claimed in claim 7, wherein each of said first clock output wiring and said first clock input wiring is embedded into an insulating film that covers said semiconductor substrate, said first connecting wiring being formed over said insulating film and connected to said first clock output wiring through a first via and to said first clock input wiring through a second via.

9. The device as claimed in claim 7, further comprising:
    a second clock input circuit formed in said semiconductor substrate and receiving the first clock signal through a second clock input wiring, said second clock input wiring being formed of said second wiring layer; and
    a second connecting wiring formed of said first wiring layer to make an electrical connection path between said first clock output wiring and said second clock input wiring.

10. The device as claimed in claim 7, further comprising:
    a second clock output circuit formed in said semiconductor substrate and outputting a second clock signal through a second clock output wiring, said second clock output wiring being formed of said second wiring layer;
    a second input circuit formed in said semiconductor substrate and having a second clock input wiring, said first clock input wiring being formed of said second wiring layer;
    a first via wiring formed in contact with a part of said second clock output wiring; and
    a second via wiring formed in contact with a part of said second clock input wiring, said second via wiring being formed adjacently to said first via wiring with an electrical isolation therefrom.

11. The device as claimed in claim 10, further comprising a second connecting wiring formed of said first wiring layer to make an electrical connection path between said first and second via wirings.

12. A semiconductor device having a multilevel wiring structure including a lower-level wiring layer, an upper-level wiring layer and an insulating film intervening between said lower-level and upper-level wiring layers, said device comprising:
    a first wiring formed of said lower-level wiring layer to convey a first clock signal;
    a first via formed in said insulating film in contact with a part of said first wiring;
    a second wiring formed of said lower-level wiring layer to convey a second clock signal;
    a second via formed in said insulating film in contact with a part of said second wiring;
    a third wiring formed of said lower-level wiring layer;
    a third via formed in said insulating film in contact with a part of said third wiring;

a fourth wiring formed of said lower-level wiring layer;
a fourth via formed in said insulating film in contact with a part of said fourth wiring;
a fifth wiring formed of said upper-level wiring layer in contact with said first via and said third via to thereby allow said first clock signal to be transferred to said third wiring; and Wherein:

said fourth via being supplied with one of a power potential and a third clock signal and being free from connection with said second via; and said upper-level wiring layer is formed as a customized wiring layer such that a pattern of said upper-layer wiring layer is determined based on customer specifications, and said lower-level wiring layer being formed as a fixed wiring layer such that a pattern of said lower-layer wiring is determined independently of the customer specifications.

13. The device as claimed in claim 12, further comprising a circuit, said fourth via being connected to said circuit to be supplied with said third clock signal.

14. The device as claimed in claim 12, wherein said first via is formed close to said third via and said second via is formed close to said fourth via.

* * * * *